(12) United States Patent
Liu et al.

(10) Patent No.: US 10,312,439 B2
(45) Date of Patent: Jun. 4, 2019

(54) MANUFACTURING METHOD FOR A NONVOLATILE RESISTIVE SWITCHING MEMORY DEVICE

(71) Applicant: Institute of Microelectronics, Chinese Academy of Sciences, Beijing (CN)

(72) Inventors: Qi Liu, Beijing (CN); Ming Liu, Beijing (CN); Haltao Sun, Beijing (CN); Hangbing Lv, Beijing (CN); Shibing Long, Beijing (CN); Writam Banerjee, Beijing (CN); Kangwei Zhang, Beijing (CN)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 15/546,218

(22) PCT Filed: May 14, 2015

(86) PCT No.: PCT/CN2015/079005
§ 371 (c)(1),
(2) Date: Jul. 25, 2017

(87) PCT Pub. No.: WO2016/123881
PCT Pub. Date: Aug. 11, 2016

(65) Prior Publication Data
US 2018/0019393 A1    Jan. 18, 2018

(30) Foreign Application Priority Data
Feb. 5, 2015   (CN) .......................... 2015 1 0061920

(51) Int. Cl.
   *H01L 45/00*   (2006.01)

(52) U.S. Cl.
   CPC .......... *H01L 45/143* (2013.01); *H01L 45/085* (2013.01); *H01L 45/1233* (2013.01);
   (Continued)

(58) Field of Classification Search
   CPC . H01L 45/143; H01L 45/1253; H01L 45/144; H01L 45/146; H01L 45/1608
   See application file for complete search history.

(56) References Cited

U.S. PATENT DOCUMENTS 8,203,171 B2 * 6/2012 Yang ................... H01L 45/1246
                                                    257/107
8,227,896 B2 * 7/2012 Jiang ..................... C23C 14/081
                                                    257/536
(Continued)

FOREIGN PATENT DOCUMENTS

CN    102593097    7/2012
CN    102849734    1/2013
(Continued)

OTHER PUBLICATIONS

Ye et al., "Thickness-Dependent Strain Effect on the Deformation of the Graphene-Encapsulated Au Nanoparticles", Journal of Nanomaterials, vol. 2014 (2014), Article ID 989672, Published Jan. 9, 2014.*
(Continued)

*Primary Examiner* — Nikolay K Yushin
(74) *Attorney, Agent, or Firm* — K&L Gates LLP

(57) ABSTRACT

A nonvolatile resistive switching memory includes an inert metal electrode, a resistive switching functional layer, and an easily oxidizable metal electrode. A graphene intercalation layer with nanopores, interposed between the easily oxidizable metal electrode and the resistive switching functional layer, is capable of controlling the metal ions, which are formed by the oxidation of the easily oxidizable metal electrode during the programming of the device, and only
(Continued)

enter into the resistive switching functional layer through the position of the nanopores. Further, the graphene intercalation layer with nanopores is capable of blocking the diffusion of the metal ions, making the metal ions, which are formed after the oxidation of the easily oxidizable metal electrode, enter into the resistive switching functional layer only through the position of the nanopores during the programming of the device, thereby controlling the growing position of conductive filament.

6 Claims, 5 Drawing Sheets

(52) U.S. Cl.
CPC ...... *H01L 45/1253* (2013.01); *H01L 45/1266* (2013.01); *H01L 45/144* (2013.01); *H01L 45/146* (2013.01); *H01L 45/1608* (2013.01)

(56) References Cited

U.S. PATENT DOCUMENTS

| | | | | |
|---|---|---|---|---|
| 8,294,132 | B2* | 10/2012 | Miao | H01L 45/08 257/1 |
| 8,546,785 | B2* | 10/2013 | Yang | H01L 27/2463 257/2 |
| 8,698,481 | B2* | 4/2014 | Lieber | B82Y 15/00 257/253 |
| 2010/0327847 | A1* | 12/2010 | Leiber | B82Y 15/00 324/71.1 |
| 2011/0140762 | A1* | 6/2011 | Jiang | C23C 14/081 327/365 |
| 2011/0240951 | A1* | 10/2011 | Yang | H01L 27/2463 257/5 |
| 2013/0009126 | A1 | 1/2013 | Venkatasamy et al. | |
| 2014/0091274 | A1* | 4/2014 | Kim | H01L 45/145 257/4 |

FOREIGN PATENT DOCUMENTS

| | | |
|---|---|---|
| CN | 102157687 | 8/2017 |
| JP | 2011238828 | 11/2011 |

OTHER PUBLICATIONS

Chinese Office Action for related Chinese Application No. 201510061920.9; action dated Jan. 23, 2018; (9 pages).
International Search Report for related International Application No. PCT/CN2015/079005; report dated Aug. 11, 2016; (4 pages).
Hong-Yu Chen, et al; "Electrode/Oxide Interface Engineering by Inserting Single-Layer Graphene: Application for HfOx-Based Resistive Random Access Memory"; IEEE International Electron Devices Meeting (IEDM); pp. 489-492; Dec. 31, 2012; (4 pages).
L. Jiang, et al; Design of advanced porous graphene materials from graphene nanomesh to 3D architectures; http://pubs.rsc.org/-/content/articlelanding/2014/nr/c3nr04555b/unauth; article issued 2014; (5 pages).

\* cited by examiner

MANUFACTURING METHOD FOR A NONVOLATILE RESISTIVE SWITCHING MEMORY DEVICE

PRIORITY CLAIM

The present application is a National Stage of International Application No. PCT/CN2015/079005 filed on May 14, 2015, which claims priority to Chinese Patent Application No. 201510061920.9, filed on Feb. 5, 2015, the entire contents of which are being incorporated herein by reference.

TECHNICAL FIELD

The present invention relates to the field of microelectronics and, more particularly, to a resistive switching memory cell structure and a manufacturing method thereof based on a nanoporous graphene intercalation layer which can control the growth position of conductive filaments.

BACKGROUND

With the increasing need for high-capacity, low-power storage used for multimedia applications, mobile communications and etc., semiconductor device market shared by non-volatile memory, especially flash memory, is becoming larger and larger, and non-volatile memory has acted as a very important type of memory. The primary characteristic of the nonvolatile memory is that it can preserve the stored information for a long period of time without power, having both the characteristic of read-only memory and very high access speed.

The nonvolatile memory on the market today is dominated by flash memory, but the flash devices have disadvantages such as overhigh operating voltages, low speed of operating, not good enough endurance, and short retention time due to the too thin tunnel oxide layer during the device shrinking. Ideal nonvolatile memory should have the conditions of low operating voltage, simple structure, non-destructive reading, fast operation speed, long retention time, good endurance and excellent scalability.

Nonvolatile resistance switching memory (RRAM: resistive switching memory) has caused great concern from the large companies and research institutes of domestic and abroad, due to its advantages of simple device structure (metal-insulator-metal), high device density, low power consumption, fast programming/erase speed, and etc. The resistance switching memory technology is based on that the resistance of the material is capable of reversibly switching between the high resistance state and low resistance state under voltage control. There are a plurality of materials proven to have resistance switching characteristic: (1) organic polymers such as polyimide (PI), AIDCN and CuTCNQ, etc.; (2) multiple metal oxides, such as magneto resistive material like Pr0.7Ca0.3MnO3, La0.7Ca0.3MnO3, doped SrTiO3 or SrZrO3 and etc; (3) binary transition metal oxides such as NiO, Nb2O5, CuOx, ZrO2, HfO2, Ta2O5, TiO2 and etc; (4) solid electrolyte, such as CuS, AgS, AgGeSe and etc.

A sandwich structure based on an easily oxidizable metal/solid electrolyte/inert metal forms a class of important non-volatile resistive switching memory (RRAM, resistive switching random memory), commonly referred to as solid electrolyte based RRAM, programmable metallization cell (PMC), or conductive bridge random access memory (CBRAM). This kind of memories have the advantages of simple structure, fast speed and low power consumption, and it is regarded as one of the strong competitors of the next generation nonvolatile storage technology by the industry. Its working principle is that, under the actuation of applied electric field, the easily anodic oxidizable metal of the metallic upper electrode A (Such as Cu, Ag or Ni, etc.) is oxidized to metal ions A+ under the action of electric field, the metal ions A+ is transferred in the solid electrolyte B under the action of electric field, moving toward the cathode and finally reaching the inert lower electrode C, where it is reduced to metal A. As the metal is continuously deposited at the lower electrode C, the deposited metal finally reaching the upper electrode A, a single or plurality of filamentous metal conductive bridges connecting the upper and lower electrodes are formed, wherein the device resistance is in a low impedance state; under the action of the reverse electric field, the metal conductive bridges are disconnected, the device is restored to a high impedance state. These two resistive states can be converted to each other by the action of the applied electric field.

However, since the process of nucleating and growing of the conductive filament is a random process, the related electrical properties of the device are highly discrete (such as programming voltage and high/low resistance state). If the formation of conductive filaments can be controlled, the uniformity of the electrical parameters of the device will be greatly improved.

SUMMARY

In view of the above, it is an object of the present invention to solve the above technical difficulties and overcome the disadvantage of the resistive switching memory based on the principle of formation and breaking of metal conductive filaments, there is provided a novel device structure and its manufacturing method capable of reducing the discretization of the electrical parameters of the resistive switching memory by controlling the position of formation and growing process of conductive filaments, improving the performance and reliability of the device.

To this end, the present invention provides a nonvolatile resistive switching memory comprising an inert metal electrode, a resistive switching functional layer, and an easily oxidizable metal electrode, characterized in that a graphene barrier layer with a plurality of nanopores is interposed between the easily oxidizable metal electrode and the resistive switching functional layer, capable of controlling the metal ions, which are formed by the oxidation of the easily oxidation of metal electrode, enter into the resistive switching functional layer only through the positions of the nanopores.

Wherein the material of the easily oxidizable metal electrode is, for example, at least one of Cu, Ag, Ni, Sn, Co, Fe, Mg, or a combination thereof; optionally, the thickness thereof is 5 nm to 500 nm.

Wherein the material of the resistive switching functional layer is a solid electrolyte or a binary oxide material with resistance switching property such as any one of CuS, AgS, AgGeSe, CuIxSy, ZrO2, HfO2, TiO2, SiO2, WOx, NiO, CuOx, ZnO, TaOx, Y2O3, or a combination thereof; optionally, the thickness thereof is 2 nm to 200 nm.

Wherein the material of the inert metal electrode is, for example, any one of Pt, W, Au, Pd or a combination thereof; optionally, the thickness thereof is, for example, 5 nm to 500 nm.

Wherein the graphene barrier layer is at least one of a monolayer or multilayer graphene film; optionally, the thickness thereof is 0.4 nm to 20 nm.

Wherein the diameter of each nanopores is from 1 nm to 20 nm; optionally, there is a single or plurality of nanopores.

The present invention also provides a method of manufacturing the nonvolatile resistive switching memory comprising: forming an easily oxidizable metal electrode on an insulating substrate; forming a graphene barrier layer with a plurality of nanopores on the easily oxidizable metal electrode; forming a resistive switching functional layer on the graphene barrier layer; and forming an inert metal electrode on the resistive switching functional layer; wherein the graphene barrier layer with a plurality of nanopores is capable of controlling the metal ions, which are formed by the oxidation of the easily oxidizable metal electrode, enter into the resistive switching functional layer only through the position of the nanopores during the programming of the device Wherein the process of forming the inert metal electrode and/or the resistive switching functional layer and/or the easily oxidizable metal electrode is electron beam evaporation, chemical vapor deposition, pulsed laser deposition, atomic layer deposition, magnetron sputtering or sol-gel method.

Wherein, the process of forming the graphene barrier layer is film transferring, tape stripping or chemical vapor deposition.

Wherein the thickness of the inert metal electrode and/or the easily oxidizable metal electrode is 5 nm to 500 nm; optionally, the thickness of the resistive switching functional layer is 2 nm to 200 nm; optionally, the thickness of the graphene barrier layer is 0.4 nm to 20 nm.

Wherein the material of the easily oxidizable metal electrode is, for example, at least one of Cu, Ag, Ni, Sn, Co, Fe, Mg, or a combination thereof; optionally, the material of the resistive switching functional layer is a solid electrolyte or a binary oxide material having resistance switching properties, such as CuS, AgS, AgGeSe, CuIxSy, $ZrO_2$, $HfO_2$, $TiO_2$, $SiO_2$, $WO_x$, NiO, $CuO_x$, ZnO, $TaO_x$, $Y_2O_3$, or a combination thereof; optionally, the material of the inert metal electrode is, for example, any one of Pt, W, Au, Pd or a combination thereof.

Wherein the nanopores are formed in the graphene barrier layer by electron beam etching or ion beam etching; optionally, each nanopore has a diameter of 1 nm to 20 nm; optionally, there is a single nanopore or a plurality of ones.

Wherein after forming the graphene barrier layer, the nanopores are formed in the graphene barrier layer by electron beam etching or ion beam etching; optionally, each nanopore has a diameter of 1 nm to 20 nm; optionally, there is a single nanopore or a plurality of ones.

Wherein before the formation of the graphene barrier layer, single or multiple nano projections are formed by etching or depositing on the easily oxidizable metal electrode, and then the graphene barrier layer formed subsequently is broken at the position of each of nano projections to form the nanopores.

Wherein a periodic structure is formed at the interface between the easily oxidizable metal electrode and the resistive switching functional layer.

Wherein the projected area of the graphene barrier layer and the easily oxidizable metal electrode is respectively larger than that of the resistive switching functional layer and the inert metal electrode, and electrode contact is formed on the exposed graphene intercalation layer.

Wherein the inert electrode is split into a plurality of small area ones.

According to the nonvolatile resistive switching memory device of the present invention and manufacturing method thereof, a graphene intercalation layer with nanopores is interposed between the easily oxidizable metal electrode and the resistive switching functional layer, capable of blocking the diffusion of the metal ions, making the metal ions, which are formed by the oxidation of the easily oxidizable metal electrode, enter into the resistive switching functional layer only through the position of the nanopores during the programming of the device, thereby the growing position of conductive filament is controlled.

BRIEF DESCRIPTION OF THE DRAWINGS

The technical solution of the present invention will be described in detail below with reference to the accompanying drawings, in which.

DETAILED DESCRIPTION

The characters and technical effects of the present invention will be described in detail by referring the drawings and accommodate with schematic embodiments, disclosing a nonvolatile resistive switching memory device and manufacturing method thereof with a graphene intercalation layer with nanopores interposed between the easily oxidizable metal electrode and the resistive switching functional layer. It should be noted that the similar signs denote the similar structure. The terms used in the present invention like 'first', 'second', 'up/upon', 'down/low/beneath/under' etc. can be used in denoting various device structures, and unless specially illuminated these terms don't imply to the relationship of space, sequence or hierarchy of the device structures.

Figure 1:
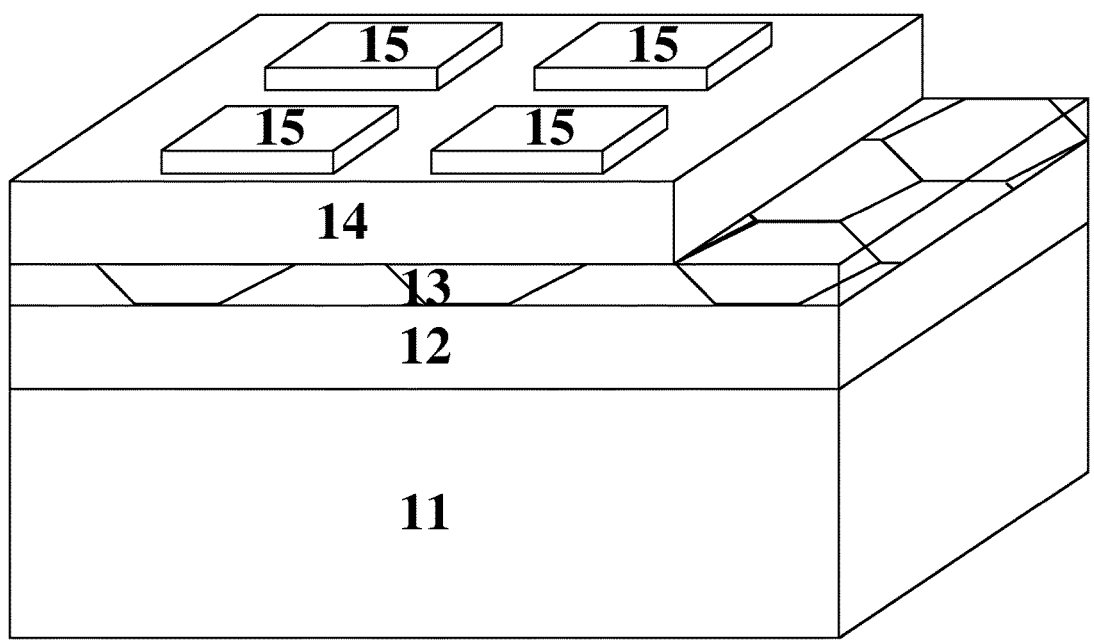
FIG. 1 is a schematic diagram of a nonvolatile resistive switching memory device according to the present invention.

A schematic view of a resistive switching memory device according to the present invention is shown in FIG. 1, which includes an insulating substrate 11, an easily oxidizable metal electrode 12, a graphene barrier layer 13 (including a plurality of nanopores 13A), a resistive switching functional layer 14, and an inert metal electrode 15. Wherein the material of the inert metal electrode 15 is at least one of Pt, W, Au and Pd or a combination thereof, and the resistive switching functional layer 14 is made of a solid electrolyte or a binary oxide material having a resistance switching characteristic, and the graphene barrier layer 13 is a monolayer or multilayer graphene film which includes an array of a plurality of nanopores 13A, and the material of the easily oxidizable metal electrode 12 is at least one of Cu, Ag, Ni, Sn, Co, Fe, Mg, or a combination thereof. During the programming process, by adopting the graphene film as a cationic barrier, the conductive filaments are controlled to only grow at the location of nano-vias in the graphene layer, reducing the randomness of conductive filament growth, thereby achieving the purpose of reducing the dispersion of electrical parameter of the device.

As shown in FIGS. 2A-2E and FIG. 3, the schematic diagrams corresponding to the respective steps of the method of manufacturing the resistive switching memory device according to the present invention are shown.

Figure 2A:
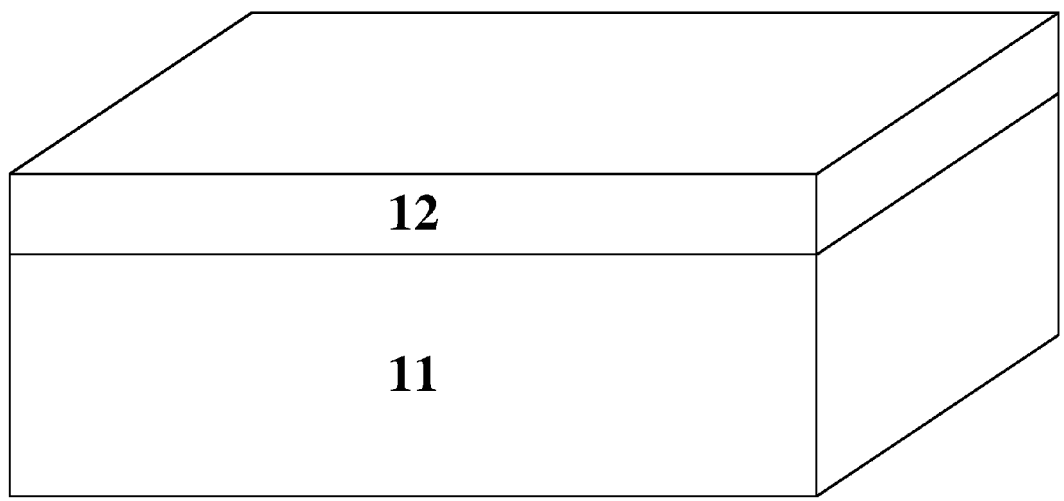
FIGS. 2A-2E are schematic views of a method of manufacturing the nonvolatile resistive switching memory device according to the present invention.

Specifically, as shown in FIG. 2A, an easily oxidizable metal electrode 12 is formed on an insulating substrate 11. The insulating substrate 11 may be a hard substrate such as silicon oxide on Si substrate, buried oxygen layer of SOI substrate, sapphire (alumina), aluminum nitride, glass, quartz, or also may be flexible substrates such as resin, or plastic and etc. By electron beam evaporation, chemical vapor deposition (including PECVD, HDPCVD, MOCVD, and etc.), pulsed laser deposition, atomic layer deposition (ALD) or magnetron sputtering, the easily oxidizable metal electrode 12 comprised of easily oxidizable metal material are deposited on the insulating substrate 11, the material thereof for example, is any one of Cu, Ag, Ni, Sn, Co, Fe, Mg, or a combination thereof (E.g., in the form of an alloy or a laminate), the thickness thereof is from 5 nm~500 nm, preferably from 10~300 nm and optimally from 50~100 nm, such as 80 nm.

Figure 2B:
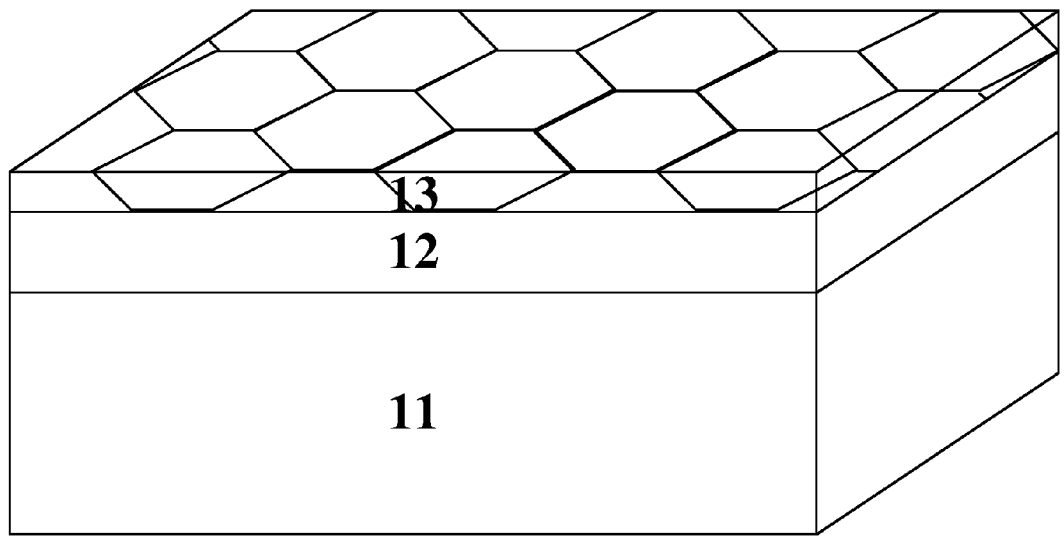

Subsequently, as shown in FIG. 2B, a metal ion barrier layer 13 made of graphene is formed on the easily oxidizable metal electrode 12. The formation of the graphene film layer may be a process using a film transfer, and the preparation of the graphene layer may be carried out by mechanical lift-off (e.g. tape peeling) or chemical vapor deposition. The thickness of the graphene barrier layer is 0.4 nm to 20 nm, preferably 0.8 nm to 16 nm. As a hexagonal grid of two-dimensional structure, the diameter of hexagonal cavity of graphene is 65 pm, much smaller than the atomic size or ion size of most atoms, so graphene is a very effective atomic diffusion barrier material. The graphene barrier layer 13 may be a monolayer or a multilayer graphene. The monolayer graphene or each layer of the multilayer structure of the graphene barrier layer 13 is flexible and bendable comparing to other hard barrier layers such as Ta, Ti, TiN, TaN, so the resistive switching device can be greatly reduced on its own thickness, and is more easily to be prepared on a flexible substrate, thus further reducing the overall impedance, so as to be capable of applying to wearable or low-power electronic devices. Preferably, the projected area of the graphene barrier layer and the easily oxidizable metal electrode is respectively larger than that of the resistive switching functional layer and the inert metal electrode to be formed later, thereby forming an electrode contact on the graphene barrier layer with a stepped structure as shown in FIG. 2D. This can further increase the areas of the graphene and easily oxidizable metal electrode so as to reduce the resistance of the device itself so as to be used in low power devices.

Figure 2C:
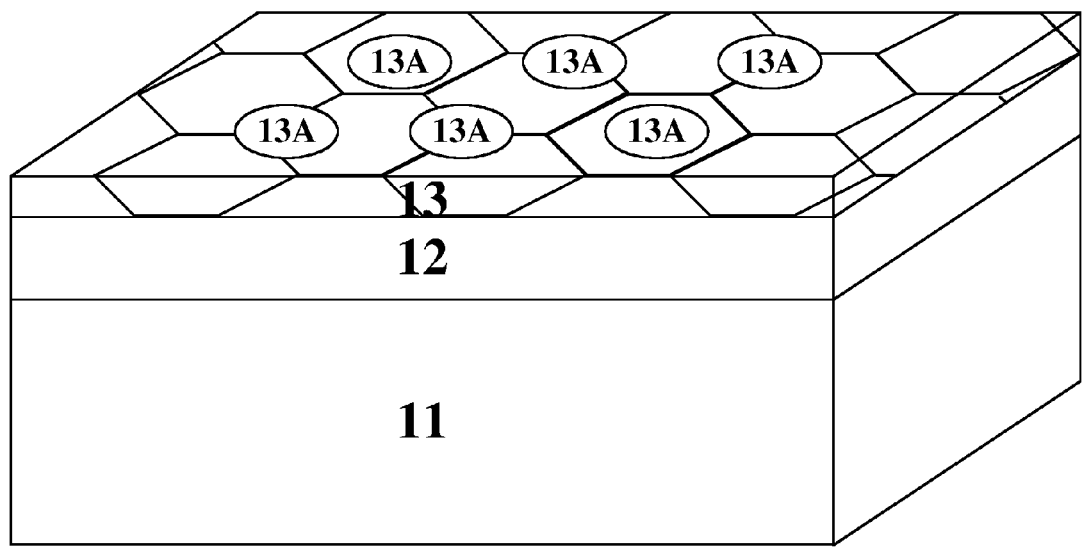
Figure 2D:
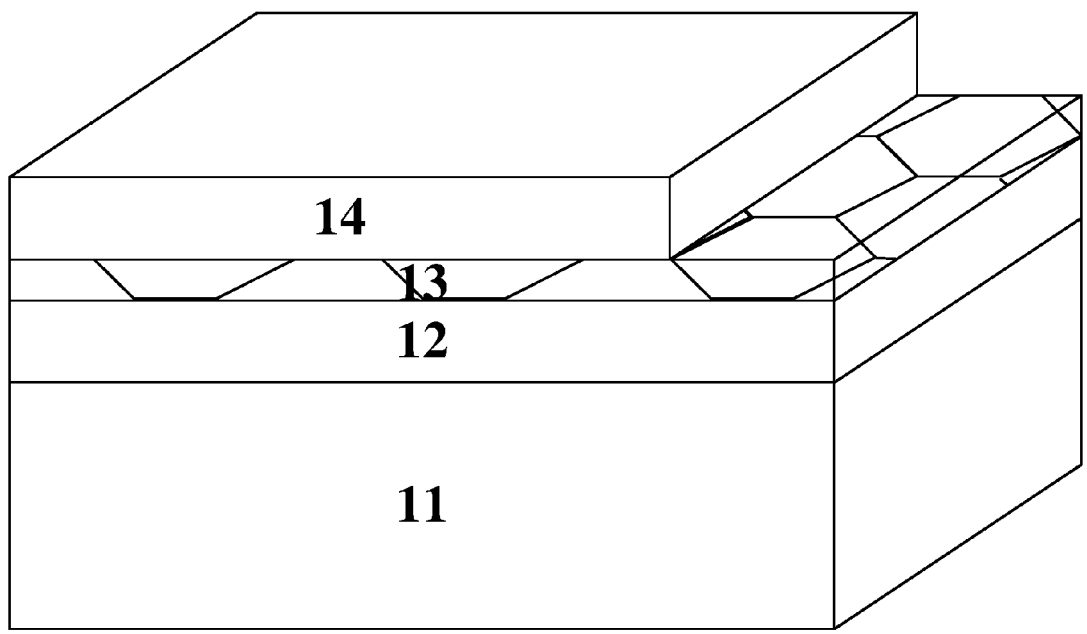

Next, as shown in FIG. 2C, the graphene barrier layer 13 is etched to form a plurality of nanopores 13A. By electron beam etching or ion beam etching, electrons or ions are driven directly under the action of high-intensity electromagnetic fields to impact the surface of the graphene film 13, sputtering to form a single or multiple nano-scale pores 13A in the selected device area. In a preferred embodiment of the present invention, there is only a single pore 13A having a diameter of 1 nm to 20 nm, preferably 3 nm to 15 nm, and optimally 5 nm. In this way, a single metal filament can be formed only through a single pore in each RRAM, exclusively controlling the distribution and size of the metal filaments in order to precisely control the resistance value. In other embodiments of the present invention, a plurality of pores 13A may be formed, for example, each RRAM has 2 to 32 pores where the spacing between each pore is 3 nm to 50 nm, preferably 5 to 20 nm. In this way, a uniform metal filament distribution can be obtained in RRAM with larger area in order to increase the uniformity of the current density and to avoid the accidental fusing of the metal filaments due to local overheating.

Next, as shown in FIG. 2D, a resistive switching functional layer 14 is formed on the graphene barrier layer 13. The resistive switching functional layer 14 may also be referred to as a resistive switching storage medium layer, which acts as an insulating spacer between the upper and lower electrodes. During the subsequent programming process, the atoms of the easily oxidized metal electrode 12 are ionized under the action of a large electric field, but are blocked by the graphene barrier layer 13 whose pore size is smaller than the atomic size. The ionized atoms can only pass through the plurality of pores 13A and then enter into the resistive switching functional layer 14 of solid electrolyte. So it is possible to control the growth of the conductive filament along the position of the nanopores by appropriately adjusting and arranging the array of the pores 13A so as to achieve the object of controlling the growth of the conductive filaments, thereby reducing the discretization of the electrical parameters of the device. The process of forming the resistive switching functional layer 14 is electron beam evaporation, pulsed laser deposition, magnetron sputtering, or sol-gel method. The resistive switching functional layer 14 is made of a solid electrolyte or a binary oxide material with a resistance transition characteristic, specifically CuS, AgS, AgGeSe, CuxSy, ZrO2, HfO2, TiO2, SiO2, WOx, NiO, CuOx, ZnO, TaOx, Y2O3 or a combination (including mixing, lamination, doping modification and the like) thereof, with a thickness in the range of 2 nm to 200 nm, preferably 5 nm to 100 nm, preferably 10 nm to 60 nm, and optimally 40 nm.

Figure 2E:
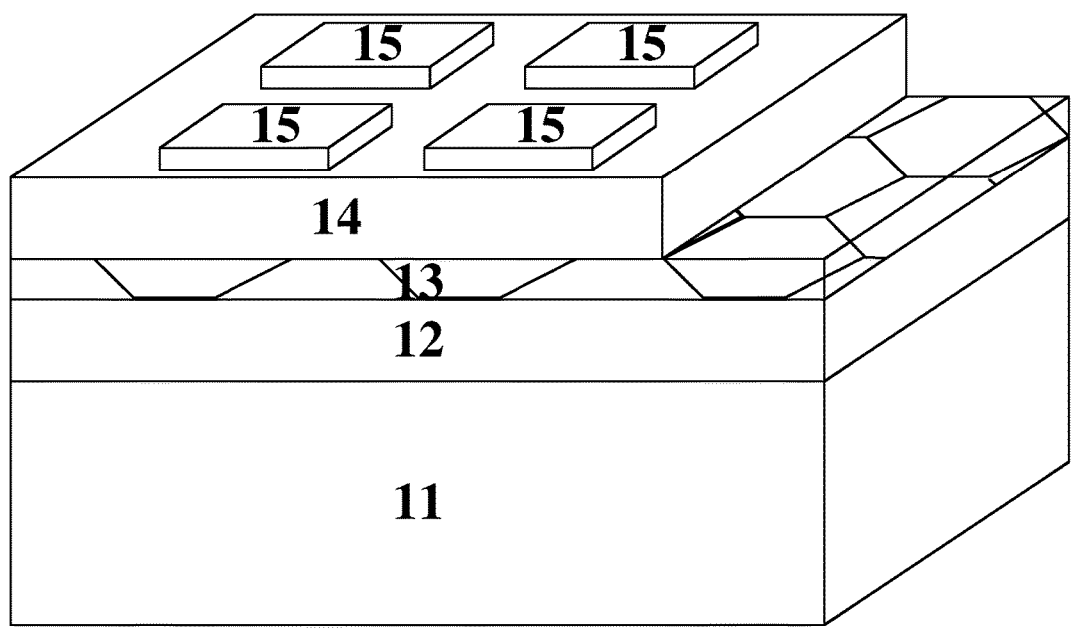
Figure 3:
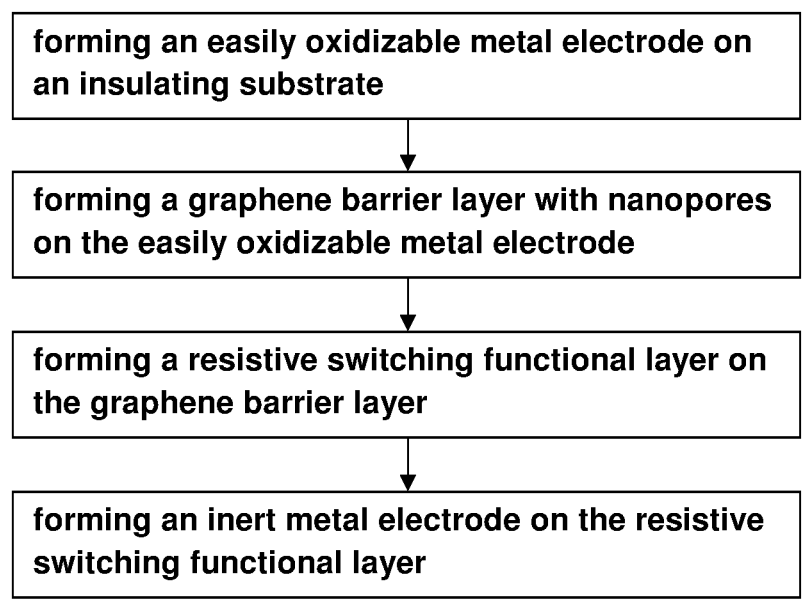
FIG. 3 is a schematic flow chat of a method of manufacturing the nonvolatile resistive switching memory device according to the present invention.

Finally, as shown in FIG. 2E, the inert metal electrode 15 is formed on the resistive function layer 14. The electrode 15 is formed by electron beam evaporation, chemical vapor deposition, pulsed laser deposition, atomic layer deposition or magnetron sputtering, and the material is inert metal such as any one of Pt, W, Au, and Pd, or a combination thereof; and the thickness thereof, for example, is 5 nm to 500 nm, preferably 10 to 350 nm and optimally 60 to 150 nm, for example, 100 nm. Preferably, a periodic pattern (not shown) is formed on the top surface of the resistive switching functional layer 14 prior to deposition of the electrode 15 by using a mask plate or periodically controlling the deposition process parameters, or after the deposition by etching, in order to increase the contact area between the electrode 15 and the resistive switching functional layers 14, thereby improving the efficiency of programming and erasing. Preferably, the electrode layer 15 is divided into a plurality of small area ones, by etching after deposition of the electrode layer 15 or depositing it with mask, thereby increasing the distribution uniformity of the current in the resistive switching device and improving the device reliability. Although the drawings of the present invention show that the electrode 12 and the graphene layer 13 are larger in area than the upper resistive switching functional layers 14, 15, these layers may also be equal in area.

In one embodiment of the present invention, firstly, using an electron beam evaporation process, a Cu thin film of 80 nm thick is magnetically sputtered on a Si substrate with an insulating layer of 200 nm thick as a lower conductive electrode layer. Then, by method of PMMA transferring, a monolayer graphene grown on the Cu foil substrate is transferred onto the lower conductive electrode layer. Next, using the etching function of the focused ion beam, a array of nanopores with diameter of 5 nm and an interval of 200 nm (for forming multiple RRAM devices at one time) is formed in the single layer of graphene; and then using magnetron sputtering deposition method, a resistance switching function layer of 20 nm SiO2 is deposited; and then using electron beam lithography method, a plurality of upper conductive electrode photoresist pattern with diameter of 50 nm and interval of 200 nm are formed over the nanopores, at last a Pt film with thickness of 50 nm is magnetron sputtered as the upper conductive electrode layer, forming a complete device structure after removing the photoresist, then dicing cutting or forming electrical isolation structure to form multiple RRAM devices. FIG. 2 shows a schematic of the process flow of this embodiment. By comparing the electrical characteristics against the resistive switching memory device grown under the same process conditions without the graphene intercalation layer, it has been found that the addition of this graphene intercalation layer can significantly reduce the operating voltage of the device and the discretization of high/low resistance.

In another embodiment of the present invention, the inert metal electrode layer 15, the resistive switching functional layer 14, the graphene barrier layer 13 having a plurality of nanopores 13A, and the easily oxidizable metal electrode layer 12 may also be sequentially deposited on the insulating substrate 11, and other materials and dimensions are same as described above.

In another embodiment of the present invention, instead of forming the nanopores by etching after the deposition of the graphene barrier layer, it is before the formation of the graphene barrier layer 13 that a plurality of nano projections (not shown) are formed by etching or depositing (periodically adjusting process parameter) on the easily oxidizable metal electrode 12, and then the graphene barrier layer 13 is broken at the position of the plurality of nano projections to form a plurality of nanopores 13A. The rest steps are similar to the previous examples.

According to the nonvolatile resistive switching memory device of the present invention and the manufacturing method thereof, a graphene intercalation layer structure with nanopores is interposed between the easily oxidizable metal electrode and the resistive switching functional layer, blocking the diffusion of the metal ions, making the metal ions, which are formed by oxidization the easily oxidizable metal electrode, enter into the resistive switching functional layer only through the positions of the nanopores during the programming of the device, thereby controlling the growing position of the conductive filaments.

Although the present invention is described with one or more specifically exemplary embodiments, one skilled in the art will recognize that various appropriate changes and equivalents of the device structure can be made without departing from the scope of the present invention. Furthermore, a great deal of modifications of specific situation or materials can be made to the disclosed enlightenment without departing from the scope of the present invention. Thus, the intent of the present invention is not limiting itself to the disclosed specifically exemplary embodiments for implementing the best implementary manner, by contrary, the disclosed device structures and the method of manufacturing the same will include all the exemplary embodiments within the scope of the invention.

What is claimed is that:

1. A method of manufacturing a nonvolatile resistive switching memory comprising:
    forming an easily oxidizable metal electrode on an insulating substrate;
    forming at least one nano projection on the easily oxidizable metal electrode by etching or providing a deposition on the easily oxidizable metal electrode;
    forming a graphene barrier layer with at least one nanopore on the easily oxidizable metal electrode, wherein the at least one nanopore is formed by breaking the graphene barrier layer at the at least one nano projection;
    forming a resistive switching functional layer on the graphene barrier layer; and
    forming an inert metal electrode on the resistive switching functional layer,
    wherein the graphene barrier layer with the at least one nanopore is capable of controlling metal ions, which are formed by oxidation of the easily oxidizable metal electrode, to enter into the resistive switching functional layer only through the at least one nanopore during programming of the nonvolatile resistive switching memory.

2. The method of manufacturing the nonvolatile resistive switching memory according to claim 1, wherein forming at least one of the inert metal electrode, the resistive switching functional layer, and the easily oxidizable metal electrode includes at least one of electron beam evaporation, chemical vapor deposition, pulsed laser deposition, atomic layer deposition, magnetron sputtering, or a sol-gel method.

3. The method of manufacturing the nonvolatile resistive switching memory according to claim 1, wherein a thickness of at least one of the inert metal electrode and the easily oxidizable metal electrode is between 5 nm to 500 nm; optionally, a thickness of the resistive switching functional layer is between 2 nm to 200 nm; optionally, a thickness of the graphene barrier layer is between 0.4 nm to 20 nm.

4. The method of manufacturing the nonvolatile resistive switching memory according to claim 1, wherein the easily oxidizable metal electrode includes at least one of Ag, Ni, Sn, Co, Fe, Mg, or a combination thereof; optionally, the resistive switching functional layer includes a solid electrolyte or a binary oxide material with resistance switching properties and includes at least one of CuS, AgS, AgGeSe, CuIxSy, ZrO2, HfO2, TiO2, SiO2, WOx, NiO, CuOx, ZnO, TaOx, Y2O3, or a combination thereof; optionally, the inert metal electrode includes at least one of Pt, W, Au, Pd or a combination thereof.

5. The method of manufacturing the nonvolatile resistive switching memory according to claim 1, wherein forming a monolayer or a multilayer graphene barrier layer includes at least one of film transferring, tape stripping, and chemical vapor deposition.

6. The method of manufacturing the nonvolatile resistive switching memory according to claim 5, wherein the at least one nano projection is formed in the graphene barrier layer by electron beam etching or ion beam etching; optionally, each nanopore has a diameter of 1 nm to 20 nm; optionally, there is a single nanopore or a plurality of nanopores.

* * * * *